US007782130B2

(12) United States Patent
Kirshner et al.

(10) Patent No.: US 7,782,130 B2
(45) Date of Patent: Aug. 24, 2010

(54) BOWTIE DEFLECTOR CAVITY FOR A LINEAR BEAM DEVICE

(75) Inventors: Mark Frederick Kirshner, Redwood City, CA (US); Richard Donald Kowalczyk, San Mateo, CA (US); Craig Bisset Wilsen, Redwood City, CA (US)

(73) Assignee: L-3 Communications Corporation, San Carlos, CA (US)

( * ) Notice: Subject to any disclaimer, the term of this patent is extended or adjusted under 35 U.S.C. 154(b) by 324 days.

(21) Appl. No.: 12/102,481

(22) Filed: Apr. 14, 2008

(65) Prior Publication Data

US 2008/0258624 A1 Oct. 23, 2008

Related U.S. Application Data

(60) Provisional application No. 60/913,181, filed on Apr. 20, 2007.

(51) Int. Cl.
*H03F 3/54* (2006.01)
*H03F 3/60* (2006.01)

(52) U.S. Cl. ............................ 330/44; 330/56; 313/421

(58) Field of Classification Search ................... 330/44, 330/46, 56; 250/396 R; 313/421
See application file for complete search history.

(56) References Cited

U.S. PATENT DOCUMENTS 4,588,920 A * 5/1986 Smith ......................... 313/422
5,376,893 A * 12/1994 Etievant et al. ............. 315/501
5,449,916 A * 9/1995 Smyth et al. ................ 250/398
5,650,751 A * 7/1997 Symons ........................ 330/45
6,380,803 B2 * 4/2002 Symons ........................ 330/45
6,593,695 B2 7/2003 Theiss
6,998,783 B2 * 2/2006 Symons ..................... 315/5.37
7,035,372 B2 4/2006 Chen

OTHER PUBLICATIONS

"Phase Noise Transfer In Resonant Optical Cavities", Denman et al.; Review of Scientific Instruments; Aug. 2001; vol. 72, No. 8; pp. 3208-3214.

* cited by examiner

*Primary Examiner*—Thuy Vinh Tran
(74) *Attorney, Agent, or Firm*—O'Melveny & Myers LLP

(57) ABSTRACT

A resonant cavity with a bowtie shape supports an electromagnetic field used to deflect the trajectory of an electron beam passing through the cavity. The short transit time of the beam across the gap maintains the cavity fields at near-optimal phase, improving interaction efficiency even for relatively low-energy beams. High interaction impedance ensures good drive-power-to-deflection conversion efficiency. The uniform field achieved across the gap enforces uniform deflection across the beam profile to maintain beam quality. Multiple bowtie cavities can be arranged to allow arbitrary two-dimensional deflections.

13 Claims, 7 Drawing Sheets

BOWTIE DEFLECTOR CAVITY FOR A LINEAR BEAM DEVICE

RELATED APPLICATION DATA

This application claims the benefit, pursuant to 35 U.S.C. §119(e), of U.S. Provisional Application Ser. No. 60/913,181, filed Apr. 20, 2007.

BACKGROUND OF THE INVENTION

1. Field of the Invention

The present invention relates to linear beam devices, and more particularly, to a resonant cavity arranged to deflect an electron beam.

2. Description of Related Art

Many applications require the deflection of an electron beam. For example, a cathode ray tube includes an evacuated region containing an electron gun that is a source of an electron beam, and a fluorescent screen. When the electron beam strikes the fluorescent screen, light is emitted from the point of impact. The electron beam may be deflected and modulated by the application of electromagnetic fields in such a way that an image is made to appear on the screen.

When deflected at very high frequencies, an electron beam can be used to produce electromagnetic radiation. It is well known in the art to use a resonant cavity to develop an electric field suitable for this purpose. For optimal performance, the cavity should exhibit the following properties: the transit time of the beam through the electric field should be less than half of an radio frequency cycle; the cavity should exhibit a high drive-power-to-deflection conversion efficiency; the beam should be deflected uniformly across the beam profile to maintain beam quality; and the geometry of the cavity should be compact to allow close spacing of multiple cavities, allowing compound deflection profiles.

A conventional solution is a cylindrical pillbox cavity operating in the transverse-electric-field $TE_{111}$ mode, as illustrated in FIG. 1 (prior art). The $TE_{111}$ mode cannot be supported in such a cavity if the height of the cavity becomes too small. This limits its application to very high-energy beams with electron velocities great enough to cross the cavity in less than half a cycle. At lower energies, re-entrant drift tube noses are required to limit the transit time, resulting in E-field depression and a considerable reduction in interaction impedance. Accordingly, it would be desirable to provide a linear beam device with a resonant cavity arranged to selectively deflect an electron beam at relatively low energy.

SUMMARY OF THE INVENTION

The invention provides a superior resonant cavity design for deflecting an electron beam. The cavity has a tapered shape that enables a short beam transit time while supporting transverse-electric-field modes within the cavity.

An embodiment of a resonant cavity in accordance with the present invention comprises a shape resembling a bowtie. A central narrow drift region is provided and adapted to allow the passage of an electron beam. Connected to one side of the drift region is a first lobe portion that has a tapered shape and that extends away from the drift region in a direction perpendicular to the direction of the electron beam passing through the drift region. The taper of the first lobe portion results in a geometry in which the portion of the lobe proximate to the drift region is smaller in cross-sectional width than the portion of the lobe distal to the drift region.

On the opposite side of the drift region, a second lobe portion similar to the first is connected. The second lobe portion is also tapered to create a structure that is larger at the distal end than at the proximal end connected to the drift region. Within both the first lobe portion and the second lobe portion, a post extends from the center of the distal wall toward the drift region. The function of the post is to concentrate an electric field applied to the cavity in order to create a bending field within the drift region to interact with the electron beam.

In one embodiment according to the present invention, the lobe portions may resemble truncated pyramids with a square or rectangular base, the truncated tops of which are connected to the drift region. In another embodiment, the lobe portions may resemble truncated cones with a circular or elliptical base, the truncated tips of which are connected to the drift region. Other geometries presenting different cross-sections through the tapered lobes are also possible and would fall within the scope and spirit of the present invention.

A single bowtie cavity in accordance with the present invention may be used in a system that generates an electron beam in order to bend the electron beam in one dimension. To bend an electron beam in two dimensions, two bowtie cavities may be arranged to align the drift regions such that the electron beam will pass through the drift regions of both the first and second bowtie cavities. The two cavities are oriented such that the lobes of the two cavities do not extend in a parallel direction. For convenience, the two cavities may be arranged to be orthogonal to one another so that each cavity may bend the electron beam in an independent direction. However, as long as the two cavities are not parallel to each other, it is possible to control the trajectory of the electron beam in two dimensions.

To control the trajectory of an electron beam in a circular or elliptical path, the phase and amplitude of electric fields may be controlled as they are applied to a first and a second bowtie cavity through which the electron beam passes. If the cavities are configured to be orthogonal to each other, and if the relative phase difference of the fields in the two cavities is constrained to be ninety degrees, a circular trajectory can be achieved by making the amplitudes of the fields in the two cavities equal. If the amplitudes are unequal, the resulting trajectory of the electron beam will be elliptical. Alternatively, if the amplitudes of the two fields are held equal, the relative phase may be adjusted to create an elliptical trajectory that flattens to a line at phase differences of zero and 180 degrees and expands to a circle at a phase difference of ninety degrees.

An alternative embodiment of a bowtie cavity in accordance with the present invention comprises a cavity with four lobe portions that lie in the same plane and that are connected to a common drift region through which an electron beam passes. The two pairs of lobes are configured to lie substantially orthogonal to one another, allowing the electron-beam trajectory to be controlled in two dimensions.

Additional systems for controlling the trajectory of an electron beam may be constructed by using multiple bowtie resonant cavities and would fall within the scope and spirit of the present invention. From the foregoing discussion, it should be clear to those skilled in the art that certain advantages of a resonant cavity design have been achieved. Further advantages and applications of the invention will become clear to those skilled in the art by examination of the following detailed description of the preferred embodiment. Reference will be made to the attached sheets of drawing that will first be described briefly.

DETAILED DESCRIPTION OF THE PREFERRED EMBODIMENT

The invention provides a resonant cavity for a linear beam device that deflects an electron beam. Unlike a conventional resonant cavity, a cavity in accordance with the present invention provides a large cavity volume capable of supporting a resonant electromagnetic field while at the same time providing a narrow drift region across which the electron beam propagates. In the detailed description that follows, like element numerals are used to indicate like elements appearing in one or more of the figures.

Figure 1:
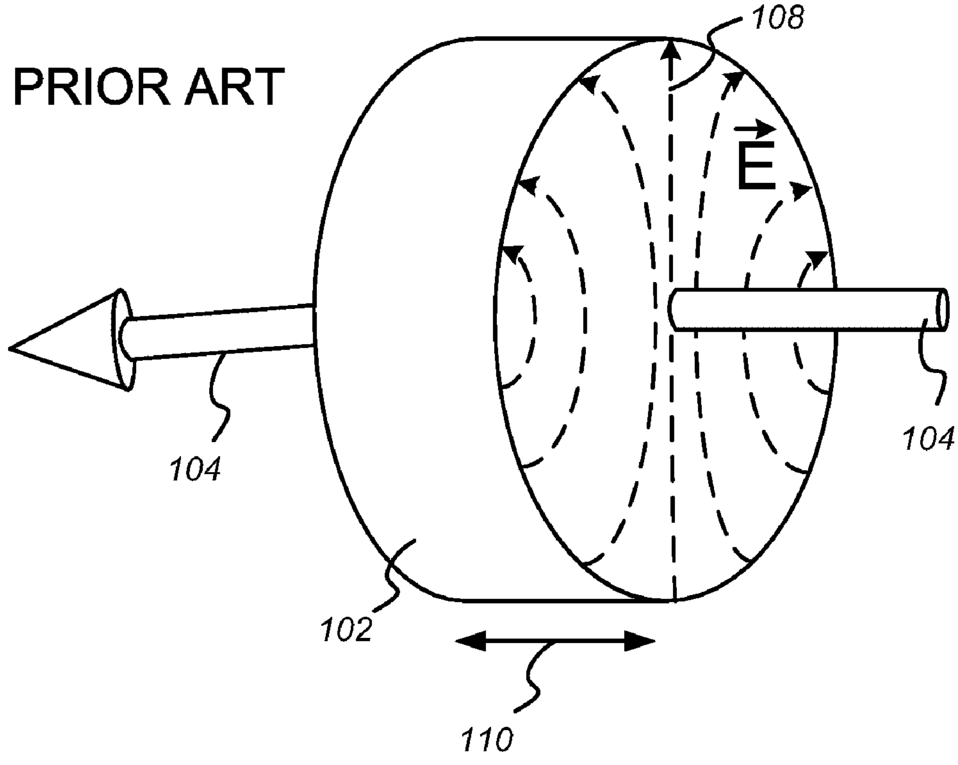
FIG. 1 is a perspective view of a conventional pillbox cavity for deflecting an electron beam.

A conventional resonant cavity, such as the pillbox cavity pictured in FIG. 1, is sized to support a resonant transverse-electric-field mode, shown schematically at 108. An electron beam 104 enters one side of the cavity 102, is bent by the electric field 108, and emerges from the other side. The path length of the electron beam through the cavity 102 is roughly equal to the cylinder height 110 of the cavity. This height must be kept large enough to support the resonant transverse-electric-field mode 108 and depends on the frequency of the electric field. In order to function properly and efficiently, the electron beam 104 entering the cavity 102 should traverse the length of the cavity in less than one half of the period of the electric field. For a given cavity height 110, only electrons exceeding a certain minimum energy will have a velocity that is high enough to do so. Thus, such a conventional cavity is limited to use with very high-energy electron beams.

Figure 2A:
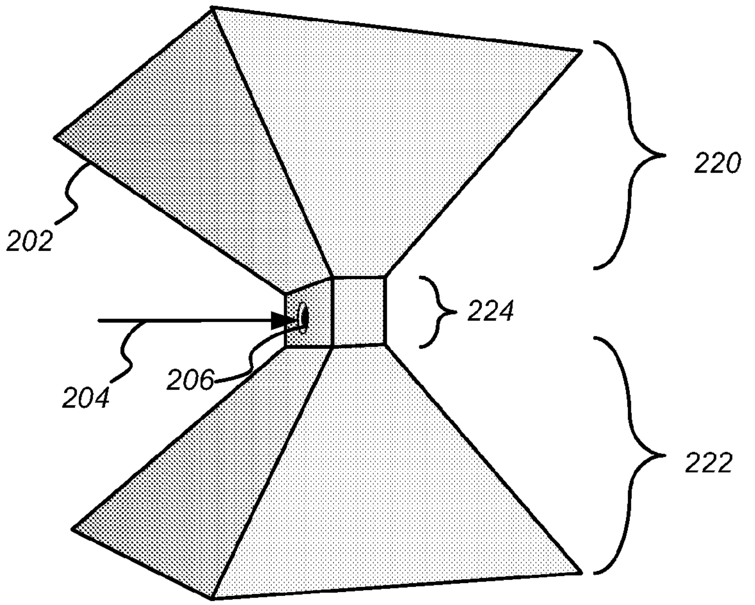
FIG. 2A is a perspective view of a bowtie deflection cavity in accordance with an embodiment of the invention.

FIG. 2A is a perspective view of an embodiment of a novel cavity design in accordance with the present invention. The cavity 202 includes two opposing conical or pyramidal lobes 220 and 222, the apex of each being joined to a shared drift region 224. Each lobe contains a post 212 (See FIGS. 2B and 2C) extending from the base towards the apex to concentrate the transverse fields in the drift region. Coupling the drive power into the cavity can be accomplished by an inductive loop. The bowtie-shaped cavity operates in a transverse-electric-field mode and can deflect an electron beam along one axis. The electron beam enters from the direction indicated at 204 and proceeds through the drift region 224 via an aperture 206 in the wall of the cavity 202. The narrow drift region dramatically improves the interaction impedance over the cylindrical pillbox cavity of FIG. 1.

Figure 2B:
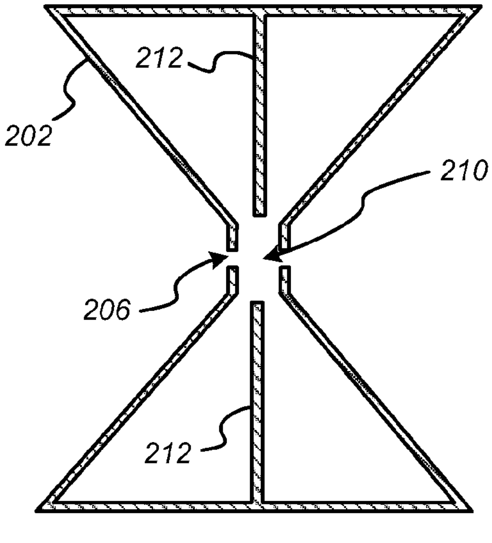
FIGS. 2B and 2C are cross-sectional views of a bowtie deflection cavity in accordance with an embodiment of the invention.
Figure 2C:
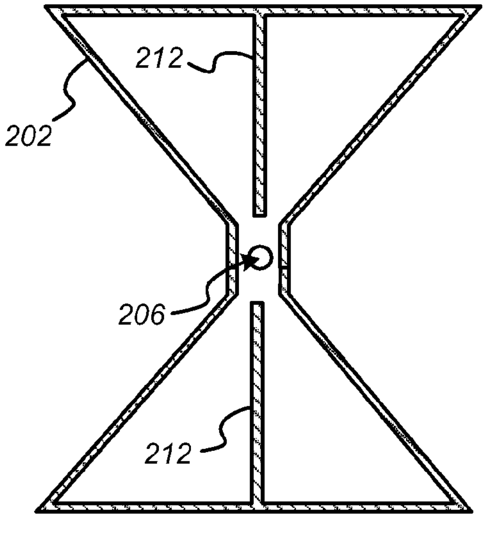

FIGS. 2B and 2C are cross-sections of the bowtie cavity depicted in FIG. 2A. FIG. 2B is a cross-section of the cavity in the plane of the electron beam which enters the cavity at 206 and proceeds across the drift region 210. FIG. 2C is a cross-section in a plane perpendicular to the direction of the electron beam, which enters through the aperture 206.

Figure 3:
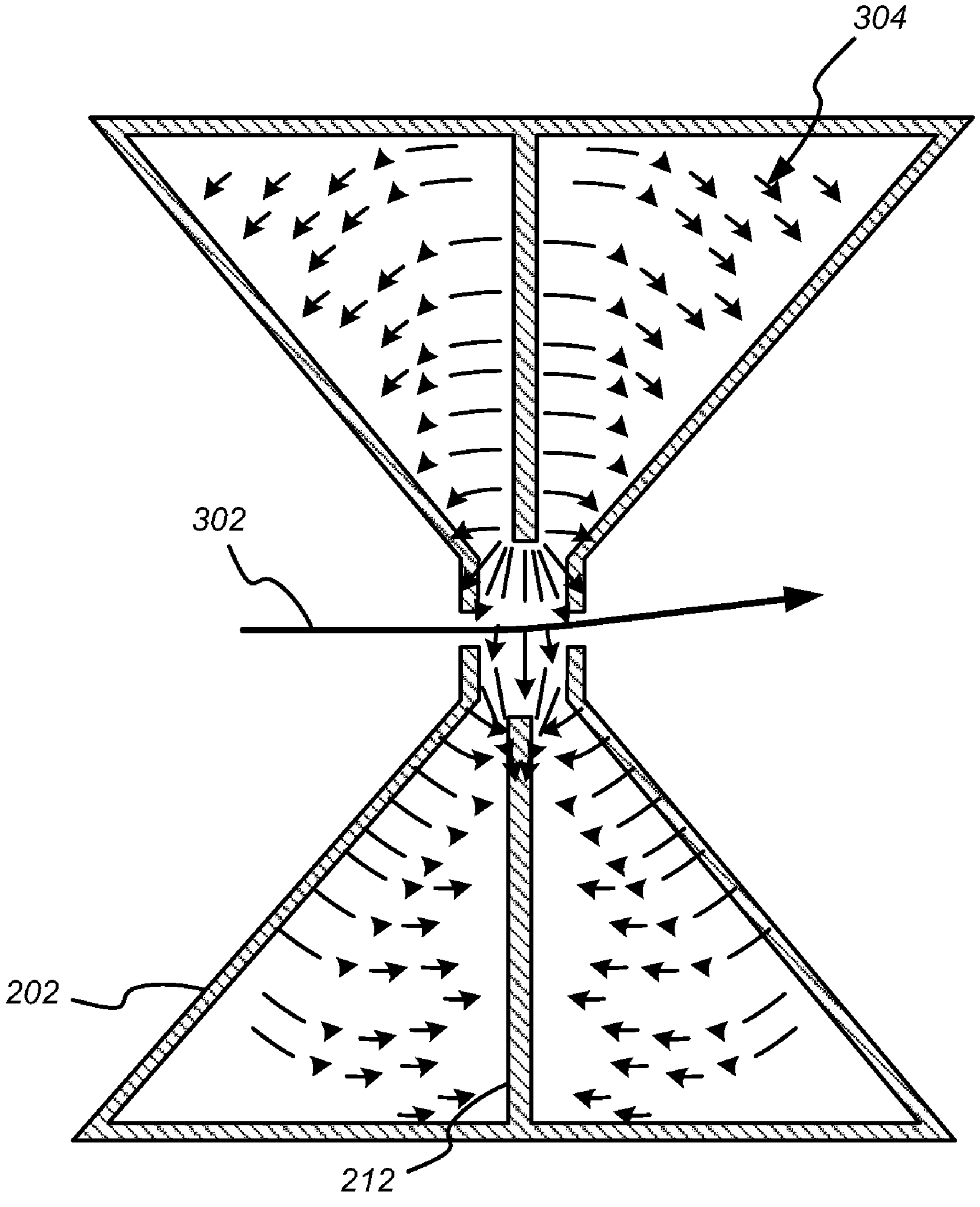
FIG. 3 is a cross-sectional view showing an electric field pattern inside the bowtie deflection cavity of FIGS. 2A-C.

FIG. 3 depicts the electric field inside an embodiment of a bowtie cavity in accordance with the present invention. The electric field lines 304 are consistent with results obtained by performing an electromagnetic simulation of the bowtie cavity using the Ansoft HFSS simulation tool. The geometry was optimized to maximize the perpendicular interaction impedance, $R/Q_\perp$, which is defined as $$R/Q_\perp = \frac{\left(\int E_\perp \cdot dl\right)^2}{\omega_o U},$$

with $E_\perp$ representing the transverse electric field, U representing the stored electromagnetic energy in the cavity, and $\omega_o$ representing the angular velocity of the drive signal supporting the electric field; the integration is performed along the path of the electron beam 302.

Figure 4:
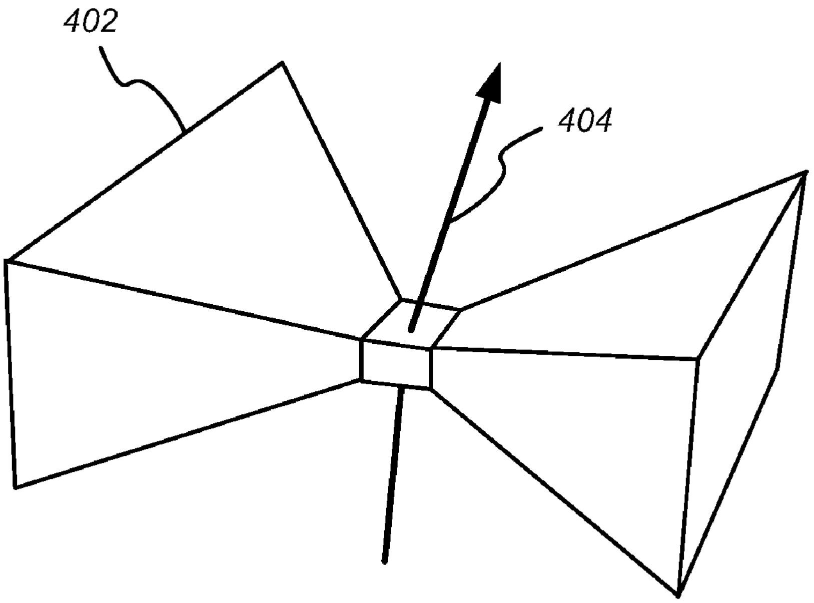
FIG. 4 is a perspective view of a single bowtie cavity.

FIG. 4 depicts a single bowtie cavity 402 that deflects the beam in one dimension, causing motion along a straight path perpendicular to the beam direction 404. If a circular or elliptical path is required, then it is necessary to deflect the beam in two dimensions. This can be accomplished using two stacked bowtie cavities, appropriately phased. In the dual bowtie circuit shown in FIG. 5, the cavities 402 and 410 are aligned such that the electron beam 412 passes through the drift regions of both bowtie cavities. The gap-to-gap electron beam transit angle is given by $$\theta = \frac{\omega_o d}{v_o}$$

where $\omega_o$ is the angular velocity of the drive signal, d is the gap-center-to-gap-center distance, and $v_o$ is the velocity of the electron beam. The electric fields in the first 402 and second 410 cavities are of the form $$E_1(t) = A\sin(\omega_o t)$$

and $$E_2(t) = B\sin(\omega_o t \pm \pi/2 \mp \theta)$$

respectively. The first cavity 402 deflects the electron beam along the direction indicated at 416. The second cavity 410 deflects the beam along the orthogonal direction 418. The phase relationship ensures that the deflection along the two axes is 90° out of phase. For a circular path, A=B; for an elliptical path, A≠B. An elliptical path can also be accomplished by appropriate phasing of the cavities with A=B.

Figure 5:
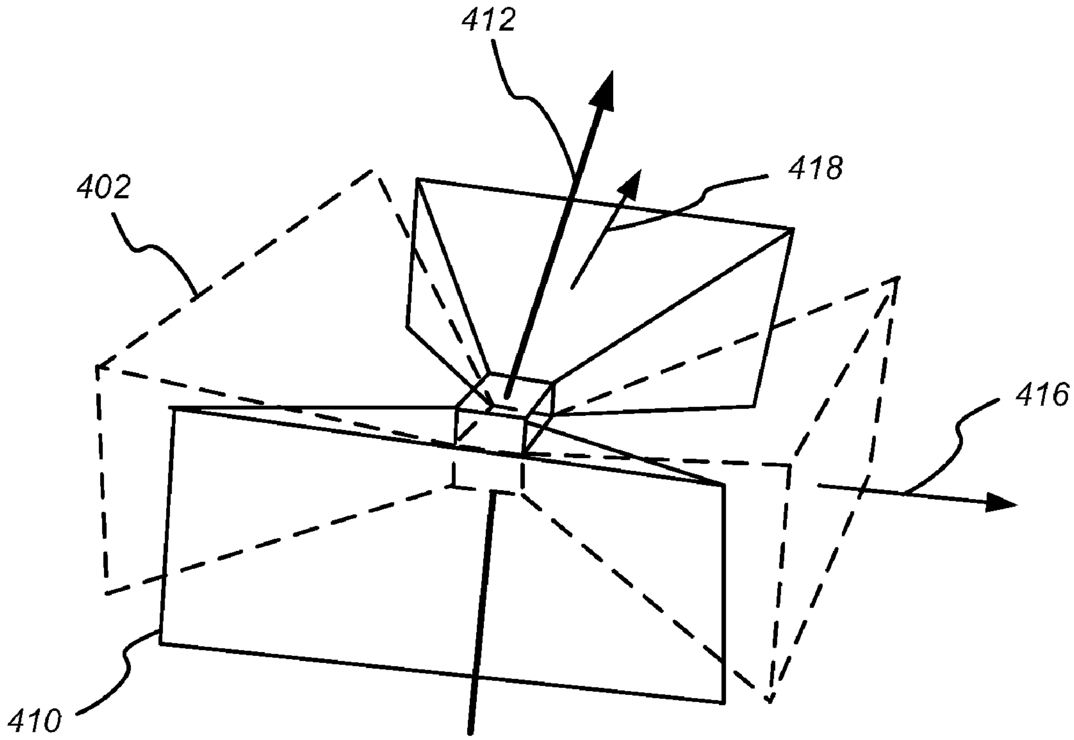
FIG. 5 is a perspective view of a double bowtie cavity.

While FIG. 5 illustrates two stacked bowtie cavities, it is anticipated that more than two bowtie cavities may be used in a single device. It may be advantageous, for example, to employ three cavities with the first and third deflecting at half strength along the same axis, either by changing the geometry or reducing the drive. Using this approach, the center of deflection along both axes occurs at the same axial location, improving beam laminarity. Other configurations, comprising one or more bowtie cavities, would also fall within the spirit and scope of the present invention.

Figure 6A:
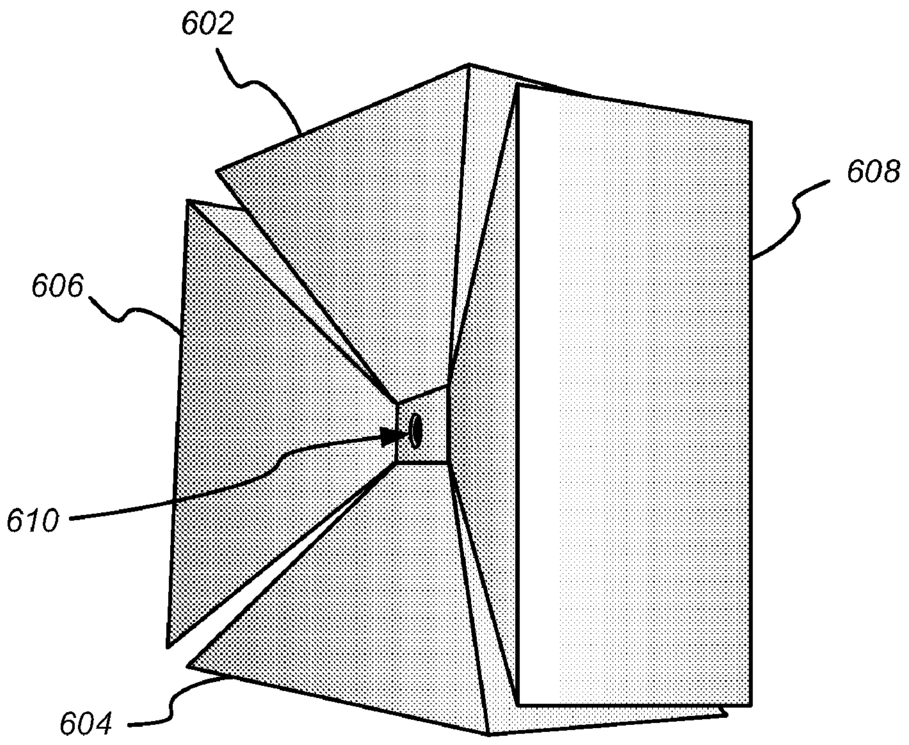
FIG. 6A is a perspective view of another embodiment of a double bowtie deflection cavity in accordance with the present invention.
Figure 6B:
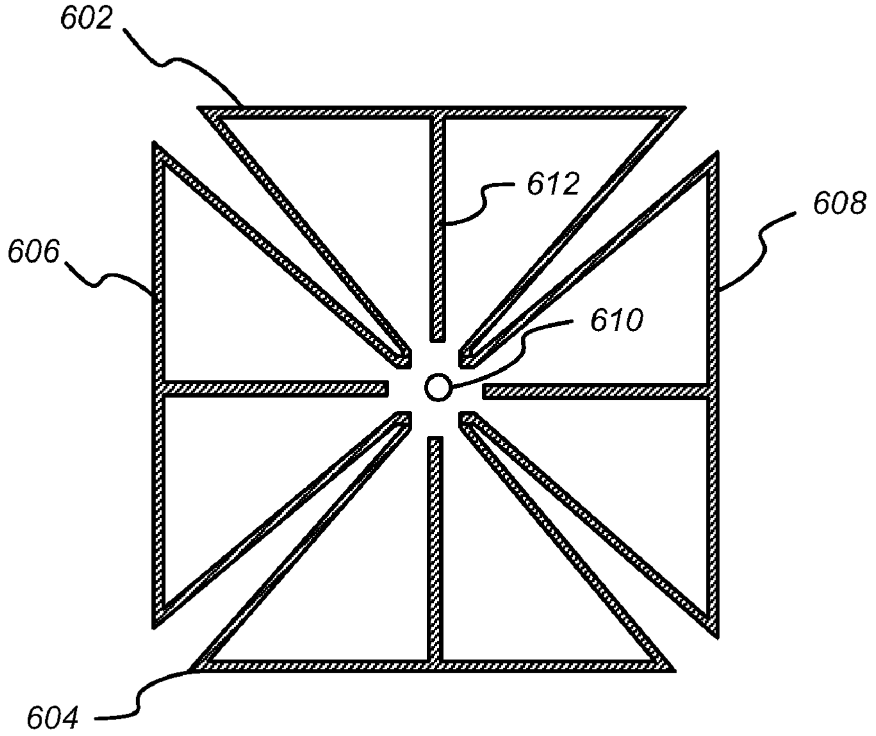
FIG. 6B is a cross-sectional view of the double bowtie deflection cavity of FIG. 6A.

FIGS. 6A and 6B depict a perspective view and a cross-sectional view, respectively, of an alternative embodiment of a double bowtie cavity in accordance with the present invention. Unlike the stacked double-bowtie cavity depicted in FIG. 5, the embodiment of FIGS. 6A-B includes four lobe portions, 602, 604, 606, and 608, that lie in the same plane and share a common drift region through which the electron beam passes. The electron beam enters through an aperture 610 and is bent through an arbitrary angle by the electric fields set up in the opposing lobe portions 602 and 604 and the orthogonal opposing lobe portions 606 and 608. Each lobe portion 602, 604, 606, and 608 includes a post structure, e.g., 612, designed to concentrate the transverse electric field in the drift region.

Figure 7:
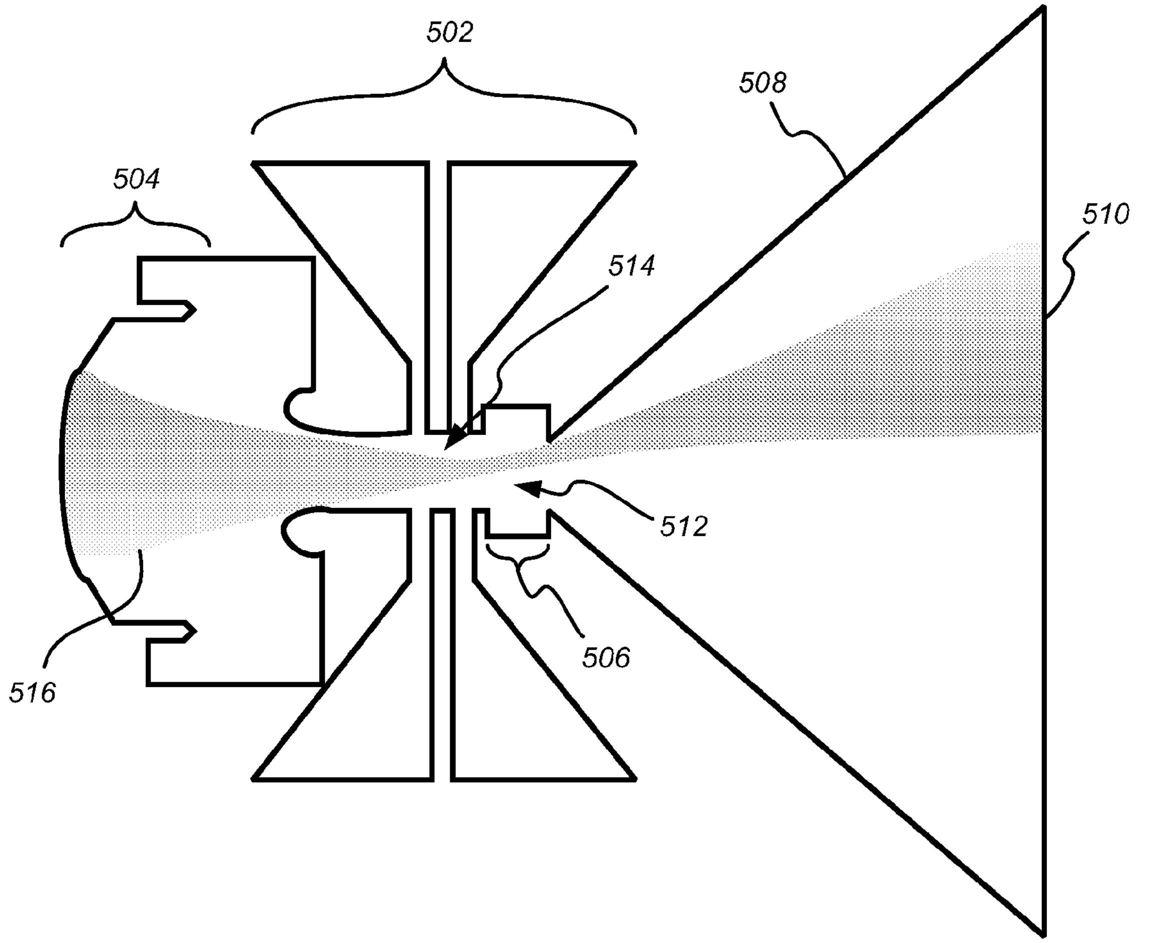
FIG. 7 depicts two bowtie deflection cavities used to control the trajectory of an electron beam in a system comprising an electron gun and a structure adapted to receive the electron beam.

FIG. 7 depicts an embodiment of an electron tube that includes two bowtie cavities in accordance with the present invention. An electron gun 504 emits electrons that are focused into a beam 516. The envelope of the beam 516 is consistent with simulations performed using the beam optics simulator MICHELLE, developed by Science Applications International Corporation (SAIC) and the Naval Research Laboratory. The electron beam passes through a first bowtie cavity 502, oriented vertically in FIG. 7. As the beam passes through the drift region 514, its trajectory is bent by an electric field developed in the first bowtie cavity 502. The electron beam then passes through a second bowtie cavity 506 that is oriented in a substantially orthogonal direction, extending into and out of the page as depicted in FIG. 7. The trajectory of the electron beam may be bent in the orthogonal direction by an electric field developed in the second bowtie cavity 506 as it propagates through the drift region 512, although in FIG. 7, only the first bowtie cavity 502 is active. The electron beam then enters a chamber 508, striking a structure 510 adapted for receiving the beam at the far end of the chamber. By controlling the electromagnetic fields within the two bowtie cavities 502 and 506, the electron beam can be bent through an arbitrary angle in two dimensions.

While the system depicted in FIG. 7 includes two bowtie cavities, other configurations comprising fewer than or more than two bowtie cavities would also fall within the scope and spirit of the present invention. In addition, systems including one or more double planar bowtie cavities of the type illustrated in FIGS. 6A-B would also fall within the scope and spirit of the present invention.

Figure 8:
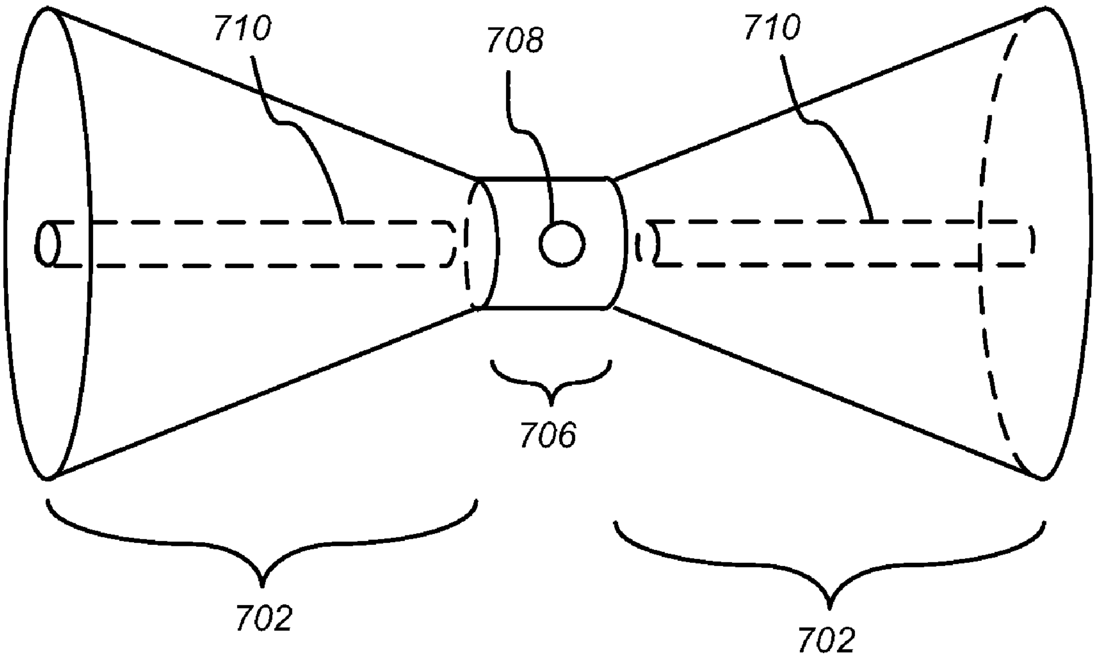
FIG. 8 is a perspective view of an alternative embodiment of a bowtie deflection cavity in accordance with the present invention in which the lobes of the cavity are conical in shape.

FIG. 8 illustrates an alternative embodiment of a bowtie cavity in accordance with the present invention. In this embodiment, the lobes 702 of the cavity have a conical shape with a circular or elliptical cross-section, as opposed to the square or rectangular cross-section of the embodiment shown in FIG. 2A. A narrow drift region 706 connects the two lobes and provides an aperture 708 allowing an electron beam to enter and traverse the drift region 706. Posts 710 extend from the base of the conical lobes 702 toward the apex and serve to concentrate the electric field presented to the electron beam traversing the drift region 706. While bowtie cavities comprising lobes with circular or rectangular cross-sections have been described, other geometric cross-sections are possible and would fall within the scope and spirit of the present invention.

Thus, a bowtie cavity according to the present invention provides a superior structure for deflecting an electron beam at high frequency. The short transit time of the beam across the gap maintains the cavity fields at near-optimal phase, improving interaction efficiency even for relatively low-energy beams. High interaction impedance ensures good drive-power-to-deflection conversion efficiency. The uniform field achieved across the gap and, in multicavity systems, the close spacing of gaps afforded by the compact geometry, enforces uniform deflection across the beam profile to maintain beam quality. Furthermore, these multicavity arrangements can be configured to allow arbitrary two-dimensional deflections. Those skilled in the art will likely recognize further advantages of the present invention, and it should be appreciated that various modifications, adaptations, and alternative embodiments thereof may be made within the scope and spirit of the present invention. The invention is further defined by the following claims.

What is claimed is:

1. A resonant electromagnetic cavity comprising:

a drift region adapted to allow the passage of an electron beam;

a first lobe portion connected to the drift region and extending in a direction substantially perpendicular to a direction of the electron beam, wherein the first lobe portion is tapered such that an end proximate to the drift region has a maximum width that is smaller than that of an end that is distal to the drift region;

a first post structure connected to the distal end of the first lobe portion and extending within the cavity toward the drift region;

a second lobe portion connected to the drift region and extending in a direction opposite to the direction in which the first lobe portion extends, wherein the second lobe portion is tapered such that an end proximate to the drift region has a maximum width that is smaller than that of an end that is distal to the drift region; and a second post structure connected to the distal end of the second lobe portion and extending within the cavity toward the drift region.

2. The resonant electromagnetic cavity of claim 1, wherein a cross-section of at least one of the first lobe portion and the second lobe portion comprises a shape that is one of a circle and an ellipse.

3. The resonant electromagnetic cavity of claim 1, wherein a cross-section of at least one of the first lobe portion and the second lobe portion comprises a shape that is one of a square and a rectangle.

4. The resonant electromagnetic cavity of claim 1, wherein the first lobe portion and the second lobe portion are sized to maximize a perpendicular interaction impedance, wherein the perpendicular interaction impedance is defined as the square of the integral of a transverse electric field within the cavity evaluated along a path of an electron beam, normalized by the product of an angular frequency of the transverse electric field and electromagnetic energy stored within the cavity.

5. A resonant electromagnetic cavity comprising:

a drift region adapted to allow the passage of an electron beam;

a first lobe portion connected to the drift region and extending in a direction substantially perpendicular to a direction of the electron beam, wherein the first lobe portion is tapered such that an end proximate to the drift region has a maximum width that is smaller than that of an end that is distal to the drift region;

a first post structure connected to the distal end of the first lobe portion and extending within the cavity toward the drift region;

a second lobe portion connected to the drift region and extending in a direction opposite to the direction in which the first lobe portion extends, wherein the second lobe portion is tapered such that an end proximate to the drift region has a maximum width that is smaller than that of an end that is distal to the drift region;

a second post structure connected to the distal end of the second lobe portion and extending within the cavity toward the drift region;

a third lobe portion connected to the drift region and extending in a direction substantially perpendicular to the direction of the electron beam and substantially perpendicular to the direction in which the first lobe portion extends, wherein the third lobe portion is tapered such that an end proximate to the drift region has a maximum width that is smaller than that of an end that is distal to the drift region;

a third post structure connected to the distal end of the third lobe portion and extending within the cavity toward the drift region;

a fourth lobe portion connected to the drift region and extending in a direction opposite to the direction in which the third lobe portion extends, wherein the fourth lobe portion is tapered such that an end proximate to the drift region has a maximum width that is smaller than that of an end that is distal to the drift region; and a fourth post structure connected to the distal end of the fourth lobe portion and extending within the cavity toward the drift region.

6. The resonant electromagnetic cavity of claim 5, wherein a cross-section of at least one of the first lobe portion, the second lobe portion, the third lobe portion, and the fourth lobe portion comprises a shape that is one of a circle and an ellipse.

7. The resonant electromagnetic cavity of claim 5, wherein a cross-section of at least one of the first lobe portion, the second lobe portion, the third lobe portion, and the fourth lobe portion comprises a shape that is one of a square and a rectangle.

8. The resonant electromagnetic cavity of claim 5, wherein the first lobe portion, the second lobe portion, the third lobe portion, and the fourth lobe portion are sized to maximize a perpendicular interaction impedance, wherein the perpendicular interaction impedance is defined as the square of the integral of a transverse electric field within the cavity evaluated along a path of an electron beam, normalized by the product of an angular frequency of the transverse electric field and electromagnetic energy stored within the cavity.

9. A system for controlling a trajectory of an electron beam comprising:

an electron gun adapted to create the electron beam;

a structure adapted to receive the electron beam; and at least one bowtie resonant cavity situated between the electron gun and the structure adapted to receive the electron beam, wherein the at least one bowtie resonant cavity comprises:

a drift region adapted to allow the passage of an electron beam;

a first lobe portion connected to the drift region and extending in a direction substantially perpendicular to a direction of the electron beam, wherein the first lobe portion is tapered such that an end proximate to the drift region has a maximum width that is smaller than that of an end that is distal to the drift region;

a first post structure connected to the distal end of the first lobe portion and extending within the cavity toward the drift region;

a second lobe portion connected to the drift region and extending in a direction opposite to the direction in which the first lobe portion extends, wherein the second lobe portion is tapered such that an end proximate to the drift region has a maximum width that is smaller than that of an end that is distal to the drift region; and a second post structure connected to the distal end of the second lobe portion and extending within the cavity toward the drift region.

10. The system of claim 9 in which the at least one bowtie resonant cavity is further adapted such that a cross-section of at least one of the first lobe portion and the second lobe portion comprises a shape that is one of a circle and an ellipse.

11. The system of claim 9 in which the at least one bowtie resonant cavity is further adapted such that a cross-section of at least one of the first lobe portion and the second lobe portion comprises a shape that is one of a square and a rectangle.

12. The system of claim 9, wherein the first lobe portion and the second lobe portion are sized to maximize a perpendicular interaction impedance, wherein the perpendicular interaction impedance is defined as the square of the integral of a transverse electric field within the cavity evaluated along a path of the electron beam, normalized by the product of an angular frequency of the transverse electric field and electromagnetic energy stored within the cavity.

13. The system of claim 9 comprising a first bowtie resonant cavity and a second bowtie resonant cavity wherein:

the first bowtie resonant cavity is situated adjacent to the second bowtie resonant cavity such that the electron beam passes through the drift regions of both the first bowtie resonant cavity and the second bowtie resonant cavity; and the first bowtie resonant cavity is oriented in a direction that is not parallel to that of the second bowtie resonant cavity such that the trajectory of the electron beam can be controlled in two dimensions.

* * * * *